United States Patent [19]

Wollin

[11] Patent Number: 5,757,187

[45] Date of Patent: May 26, 1998

[54] APPARATUS AND METHOD FOR IMAGE FORMATION IN MAGNETIC RESONANCE UTILIZING WEAK TIME-VARYING GRADIENT FIELDS

[75] Inventor: Ernest Wollin, Leesburg, Fla.

[73] Assignee: Wollin Ventures, Inc., Leesburg, Fla.

[21] Appl. No.: 916,423

[22] Filed: Aug. 22, 1997

Related U.S. Application Data

[63] Continuation of Ser. No. 712,215, Sep. 11, 1996, abandoned, which is a continuation of Ser. No. 479,565, Jun. 7, 1995, abandoned, which is a continuation-in-part of Ser. No. 432,939, May 1, 1995, abandoned, which is a continuation of Ser. No. 81,188, Jun. 24, 1993, Pat. No. 5,412,322.

[51] Int. Cl.$^6$ ........................................... G01V 3/00
[52] U.S. Cl. ........................................... 324/306; 324/318
[58] Field of Search ........................... 324/318, 306, 324/322, 300, 314, 312; 335/299, 296; 128/653.5

[56] References Cited

U.S. PATENT DOCUMENTS

| | | | |
|---|---|---|---|
| 4,455,527 | 6/1984 | Singer | 324/316 |
| 4,639,671 | 1/1987 | Macovski | 324/309 |
| 4,887,039 | 12/1989 | Roemer et al. | 324/318 |
| 4,893,083 | 1/1990 | Overweg et al. | 324/318 |
| 4,916,417 | 4/1990 | Rath | 324/318 |
| 4,993,414 | 2/1991 | Macovski et al. | 324/306 |
| 5,041,790 | 8/1991 | Tropp et al. | 324/318 |
| 5,132,621 | 7/1992 | Kang et al. | 324/318 |
| 5,274,331 | 12/1993 | Macovski | 324/309 |
| 5,412,322 | 5/1995 | Wollin | 324/318 |

OTHER PUBLICATIONS

Rath, "Design and Performance of a Double Tuned Bird Cage Coil" J. of Mag. Res. vol. 86, pp. 488-495 (1990).

*Primary Examiner*—Louis M. Arana
*Attorney, Agent, or Firm*—Foley & Lardner

[57] ABSTRACT

Weak oscillating gradients are used to modulate the angular momentum of the spins in a magnetic resonance imaging apparatus producing output signals in the receiver coil which can be synchronously demodulated to yield a periodic envelope containing integral harmonics of the oscillating gradient frequency. This periodic envelope is subjected to synchronous detection, continuously yielding the amplitudes of the individual harmonic components of the envelope which are then used to approximate an integral equation by a matrix solution to a linear transformation which generates the Radon transform of the transverse magnetization along the direction of the oscillating gradient, permitting image reconstruction. Truncation (Gibbs) artefacts are eliminated. Synchronous demodulation and synchronous detection of the impulse spectrum of the output signal from the receiver coil suppresses the continuous spectrum Johnson noise. The very weak higher harmonics are synchronously detected over multiple periods yielding an improved estimate of their central tendency.

22 Claims, 8 Drawing Sheets

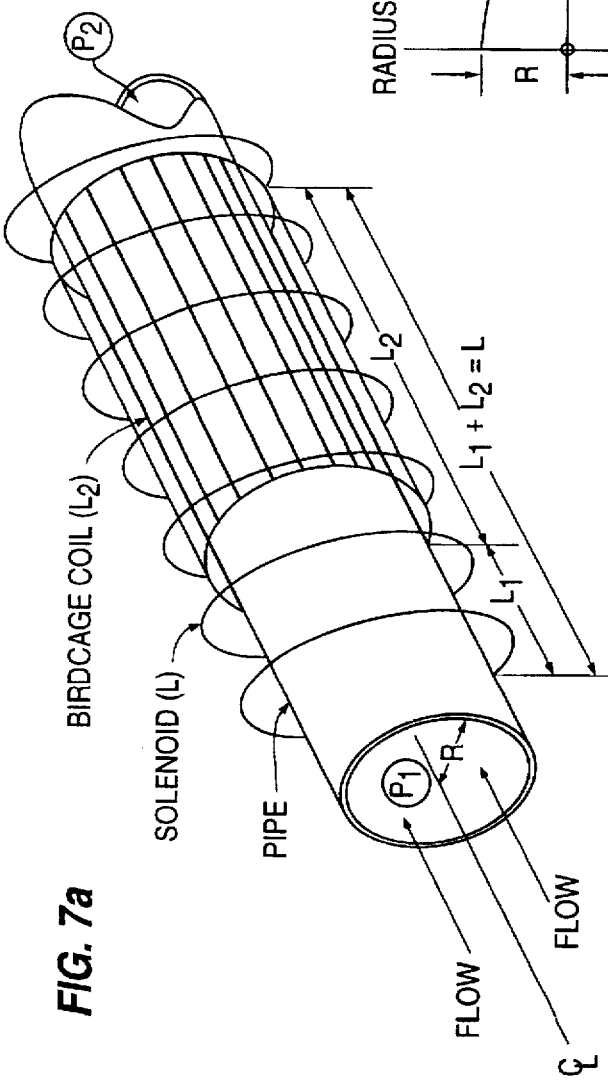
FIG. 7a
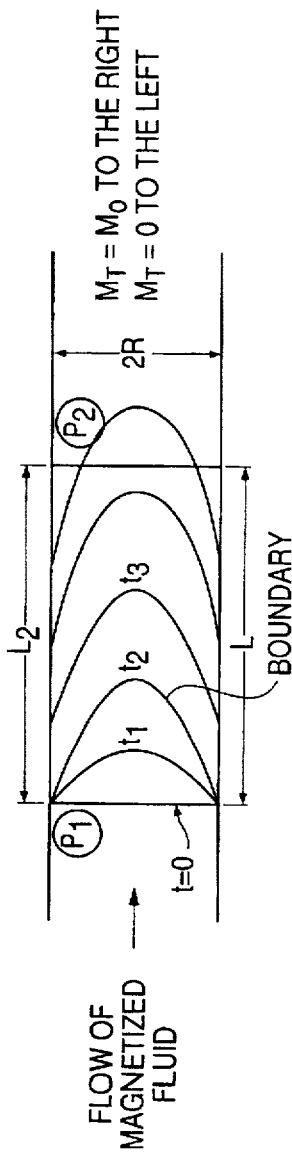
FIG. 7b
$$v(r) = \frac{P_1 - P_2}{4L\eta}(R^2 - r^2)$$
$L, L_1, L_2$ = LENGTH
$P_1, P_2$ = PRESSURE
$\eta$ = VISCOSITY
$R, r$ = RADIUS
(PARABOLA)
FIG. 7c
$M_T = M_0$ TO THE RIGHT
$M_T = 0$ TO THE LEFT

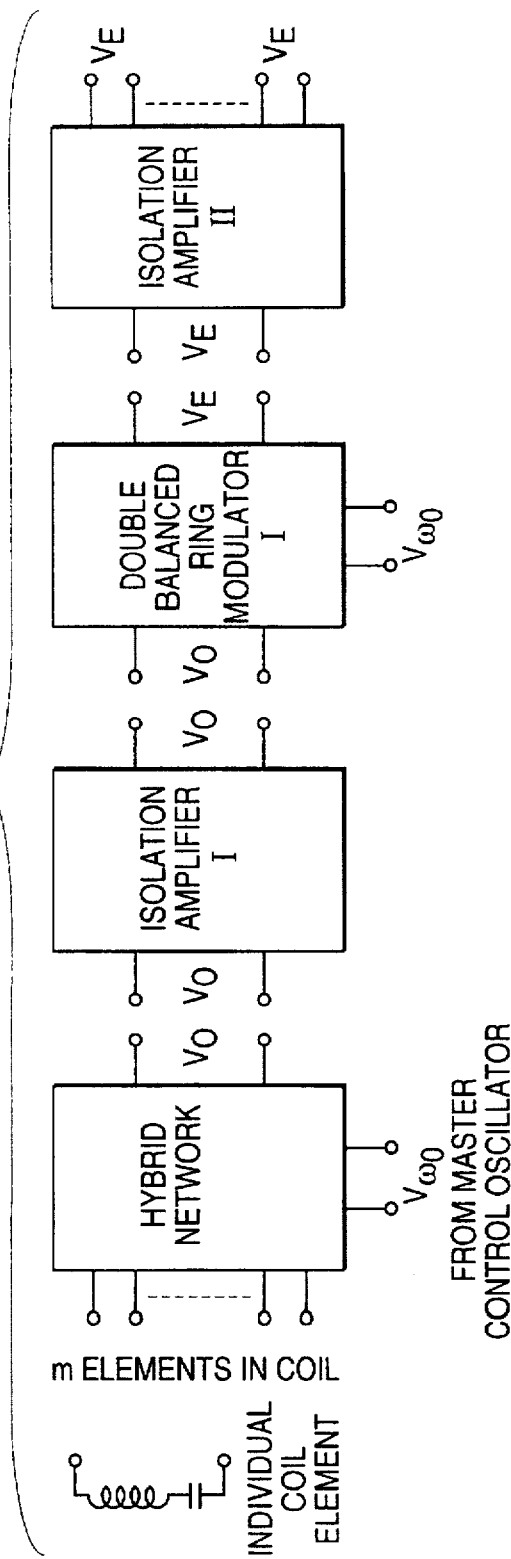
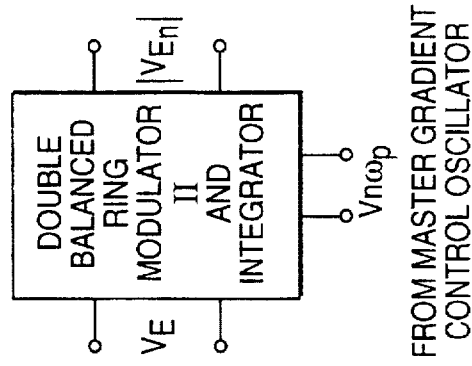
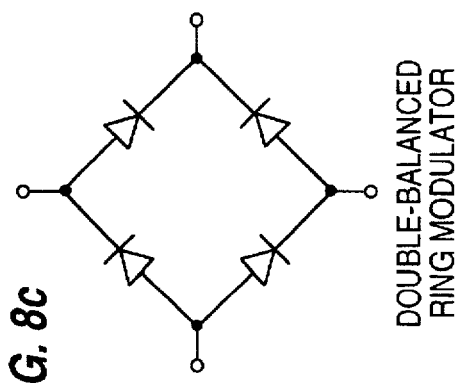
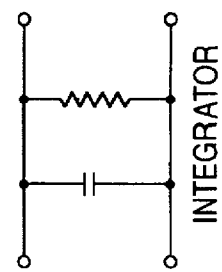
FIG. 8a
FIG. 8d
FIG. 8c
FIG. 8b

APPARATUS AND METHOD FOR IMAGE FORMATION IN MAGNETIC RESONANCE UTILIZING WEAK TIME-VARYING GRADIENT FIELDS

This application is a continuation of application Ser. No. 08/712,215, filed Sep. 11, 1996, now abandoned, which is a continuation of application Ser. No. 08/479,565, filed Jun. 7, 1995, now abandoned, which is a continuation-in-part of application Ser. No. 08/432,939, filed May 1, 1995, now abandoned, which is a continuation of application Ser. No. 08/081,188, filed Jun. 24, 1993, now U.S. Pat. No. 5,412,322.

BACKGROUND OF THE INVENTION

1. Field of the Invention

This invention is generally concerned with magnetic resonance imaging (MRI) and, more particularly, to the formation of gradient fields in an imaging volume.

This invention is further generally concerned with magnetic resonance imaging (MRI) and, more particularly, to the demodulation and detection of the output signal from the receiver coil in systems employing time-varying gradients.

2. Description of the Prior Art

Prior art systems employing time-varying gradients were first described by Mansfield and Morris in NMR Imaging in Biomedicine, Academic Press, Inc. 1982. Applications of time-varying gradients in existing magnetic resonance imaging systems, Stanford University 1985. Many other "single-shot" techniques (spiral, spiral-interlaced, square spiral) are well known and discussed in "Foundations of Medical Imaging" by Cho et. al., John Wiley & Sons, Inc., 1993. All prior art systems employ analog-to-digital conversion and digital computation of the fast Fourier tranform for image reconstruction.

Limitations of signal sampling time truncate the Fourier integral. The resultant computation is still the best approximate of the desired function in the "least squares" sense, but limits the spatial resolution of the computer function because of the Gibbs phenomenon which redistributes the high spatial frequencies near discontinuities (sharp edges) in the image. Thus, the information most useful in many applications (anatomic detail) is degraded although other less critical information (tissue contrast) is preserved.

Overcoming sampling time limitations by increasing the gradient field strength requires high magnetic field slew-rates which induce hazardous eddy currents in the imaging volume. Acceptable limits of patient current density vary with frequency and have been extensively studied and tabulated in the "Radiofrequency Radiation Dosimetry Handbook" by Durnet et. al., University of Utah Electrical Engineering Department, 4th ed., 1986, USAESAM-TR-85-73.

Time-varying gradient fields can be created by time-varying electric fields as described in my U.S. Pat. No. 5,412,322. The same limitations on current density apply in medical imaging. But the permissible gradient strength and the gradient homogeneity are favorably affected by increasing the oscillating gradient frequency into the high audio frequency range, limiting analog-to-digital sampling of the higher harmonics of the periodic output signal.

A prior art MRI apparatus, such as that depicted in FIG. 1 and disclosed in U.S. Pat. No. 4,952,878, which is hereby incorporated by reference, is comprised of a magnet system 2 and a magnet supply source 6 for generating a homogeneous stationary magnetic field $H_o$. A magnet system 4 and a supply source 8 generate magnetic gradient fields and an RF coil 10, connected to an RF amplifier 12, generates a radio frequency alternating magnetic field.

The uniform magnetic field Ho produced by the magnet system 2 and the magnet supply source 6 is formed within an imaging volume along a z axis and causes the nuclei within the object to tend to be aligned along the z axis. The nuclei precess about the z axis at their Larmor frequencies according to the following equation:

$$\omega_o = \gamma H_o \qquad \text{EQ. (1)},$$

where $\omega_o$ is the Larmor frequency at a field strength of $H_o$ and $\gamma$ is the gyromagnetic ratio. The gyromagnetic ratio $\gamma$ is a constant and is a property of the particular subatomic particle. For instance, the gyromagnetic ratio $\gamma$ for water protons is 4.26 kHz/gauss. Thus, in a 1.5 Tesla polarizing magnetic field $H_o$, the resonant or Larmor frequency of water protons is approximately 63.9 MHz.

In a typical imaging sequence, the RF coils 10 are used to generate an RF signal centered at the Larmor frequency $\omega_o$. In conjunction with this RF signal, a magnetic field gradient $G_Z$ is generated with the gradient coils 4 so that only the nuclei in a selected slice through the object along the x-y plane, which have a resonant frequency centered at the Larmor frequency $\omega_o$, are excited and absorb energy. Next, the gradient coils 4 are used to produce magnetic field gradients along the x and y axes. Generally speaking, the x axis gradient $G_X$, spatially encodes the precessing nuclei continuously by frequency and the y axis gradient $G_y$ is used to pulse phase encode the nuclei.

The RF coils 10 may be formed in the design of a "bird-cage" or a "squirrel cage" as shown in FIG. 2. Other RF coil designs are also known, such as those disclosed in U.S. Pat. Nos. 4,717,881, 4,757,290, 4,833,409, 4,916,418, 5,017,872, 5,041,790, 5,057,778, and 5,081,418. The RF coils 10 generate a circularly polarized RF field which rotates near the Larmor frequency over the antenna wires 30 of the coil. The RF coils 10 are also used to detect signals from the object and to pass the detected signals onto a signal amplifier 14, a phase-sensitive rectifier 16, and to a control device 18.

A description of the above process is given in more detail below. The spins of the nuclei have an angular momentum $\bar{S}$ which is related to their magnetic moment $\bar{\mu}$ through the gyromagnetic ratio $\gamma$, by the equation:

$$\bar{\mu} = \gamma \bar{S} \qquad \text{EQ. (2)}.$$

With reference to FIG. 3, a single nucleus 1 has a magnetic moment 3. All of the spins are subjected to a total ambient magnetic field $\bar{H}$ defined by the equation:

$$\bar{H} = \bar{i} h_x + \bar{j} h_y + \bar{k}(H_o + h_z) \qquad \text{EQ. (3)}.$$

As a result of the total magnetic field $\bar{H}$, a torque $\bar{T}$ is produced on each spin. With reference to FIG. 3, the total magnetic field H produces a torque $\bar{T}$ on the nucleus 1 to cause the nuclei 1 to precess. The torque $\bar{T}$ produced is defined by the following equation:

$$\bar{T} = \bar{\mu} \times \bar{H} = \frac{d\bar{S}}{dt} . \qquad \text{EQ. (4)}$$

Substituting and rearranging from the above equations yields:

$$\frac{d\bar{\mu}}{\mu} = \left(\frac{\bar{\mu}}{\mu} \times \gamma \bar{H}\right) dt, \quad \text{EQ. (5)}$$

or, $$d\bar{\Phi} = (\bar{\Phi} \times \gamma \bar{H}) dt \quad \text{EQ. (6)}$$

From equation (6), it is evident that the differential spatial phase increment $d\bar{\Phi}$ of each spin is related to a cross product of the direction of each spin $\bar{\Phi}$ with the ambient magnetic field $\bar{H}$ multiplied by the gyromagnetic constant $\gamma$.

Substituting from the above equations yields:

$$d\bar{\Phi} = (\bar{\Phi} \times \Gamma(\bar{i}h_x + \bar{j}h_y)) dt + (\bar{\Phi} \times \Gamma \bar{k}(H_o + h_z)) dt \quad \text{EQ. (7)}$$

or $$d\bar{\Phi} \Delta d\bar{\theta} + d\bar{\Phi} \quad \text{EQ. (8)}$$

where $d\bar{\theta}$ is the differential increment of spatial phase of the precession of $\bar{\mu}$ about an axis perpendicular to the z axis and $d\bar{\Phi}$ is the differential increment of the spatial phase of the precession of $\bar{\mu}$ about the z axis 7. Therefore, the time-varying angular relationship of each magnetic moment $\bar{\mu}$ is controlled by the applied ambient magnetic field $\bar{H}$.

A differential increment $d\bar{\theta}$ of $\bar{\mu}$ is produced when $\bar{i}h_x + \bar{j}h_y$ rotates synchronously with $\bar{\Phi}$ at the Larmor frequency. Often, the RF coils 10 are used to create such a circularly polarized RF magnetic field which rotates at the Larmor frequency $\omega_o$ by selectively choosing the values of $\bar{i}h_x + \bar{j}h_y$. As a result, an interaction energy $W_m$ is transferred to the spins and is given by:

$$dW_m = T \cdot Q\bar{\theta} = -(\bar{\mu} \times \bar{k}(H_o + h_z)) \cdot d\bar{\theta} \quad \text{EQ. (9)}$$

$$W_m = \mu(H_o + h_z)(\cos\theta - 1) \quad \text{EQ. (10)}$$

If the spins are coupled to the surrounding medium to permit relaxation to the minimum energy $W_m$ state before the application of $\bar{i}h_x + \bar{j}h_y$, then the average value of $\bar{\theta}$ for a discrete volume of spins will be at a minimum. The vector sum of each of the magnetic moments $\bar{\mu}$ in a discrete volume will then produce a net magnetization $\bar{M}$ aligned with the z axis. The precessions of the spins $\bar{\theta}$ produced by $\bar{i}h_x + \bar{j}h_y$ about an axis perpendicular to the z axis will give the net magnetization $\bar{M}a$ transverse component $\bar{M}_T$ with a spatial phase $\phi$. The strength of the transverse magnetization $\bar{M}_T$ is a function of the number of spins in each discrete sample volume and of the previous excitation and relaxation history of these spins. The transverse magnetization $\bar{M}_T$ is a component of the intensity of a total rotating flux density $\bar{B}_T$ through the permeability of free space $\mu_o$ where:

$$\bar{B}_T = \mu_o (\bar{i}h_x + \bar{j}h_x + \bar{j}h_y + \bar{M}_T) \quad \text{EQ. (11)}$$

If an antenna loop is placed with its area vector perpendicular to the z axis, it will have a voltage induced in it which is proportional to the time derivative of $\bar{B}_T$ and also a function of the geometry of the conducting antenna loop and of the spatial distribution of the discrete sample volumes, each containing a singular value of $\bar{B}_T$. This functional dependance is given by the Maxwell-Faraday equation and the vector reception field of the antenna geometry, which may be determined by experimentation.

The transverse magnetization MT has an instantaneous rotational frequency:

$$\frac{d\phi}{dt} = \gamma(H_o + h_z)\Delta\omega_o + \omega_z \quad \text{EQ. (12)}$$

$$\omega_o \Delta \gamma H_o; \quad \omega_z \Delta \gamma h_z. \quad \text{EQ. (13)}$$

A polar vector field G is defined as the gradient of $h_z$ and is determined according to the following equation:

$$\bar{G} = \nabla h_z = \bar{i}\frac{\partial h_z}{\partial x} + \bar{j}\frac{\partial h_z}{\partial y} + \bar{k}\frac{\partial h_z}{\partial z}. \quad \text{EQ. (14)}$$

As discussed above with reference to FIG. 1, the gradient magnets 4, or other type of "gradient coils," provide a spatial address for each discrete component of the imaging volume. The polar vector field $\bar{G}$, having components $G_x$, $G_y$, and $G_z$ defined by Equation 14, is successively incremented by driving the gradient coils over a longer pulse interval or by incrementing the amplitude of the driving current. The signal from the imaging volume is analyzed by Fourier transformation or other integral transformation, to produce a mathematical representation of the spatial address of the transverse magnetization $\bar{M}_T$ in the complex plane.

A problem with many prior art MRI systems, however, is that the time needed to produce the image is relatively long, for instance about 6 minutes. During this time the object to be imaged, for instance the patient, must remain motionless.

The prior art MRI systems are also at a disadvantage due to the manner in which gradient fields are produced. Gradient field generating systems, such as the supply system 8 and the gradient magnet system 4 of FIG. 1, must be able to quickly pulse large currents while precisely controlling the magnitudes of these currents. The pulsing of the large currents produces a pounding noise which often times must be blocked out with earplugs. Although many types of MRI pulse sequences can help reduce the time needed to scan an image, the circuitry in these supply systems becomes extremely complex as well as very costly, in order to provide precise control of large currents.

An additional problem with many MRI systems is that they are unable to generate rotating gradient fields that are sufficiently linear for projection reconstruction images acquisition techniques. Thus, these MRI systems are incapable of producing images by techniques such as projection reconstruction, but must instead rely upon a two or three dimensional truncated Fourier series and the Fourier transformation to produce an image.

The prior art MRI systems further suffer from a disadvantage in that the gradient fields are only produced to a first order approximation of the desired linear gradient fields. Because the gradient fields produced only approximate the desired linear fields, some of the image reconstruction systems used in the prior art systems suffered as a result.

Prior art magnetic resonance flow meters either measure the "time-of-flight" of magnetized or saturated fluid flow or map the phase acquired by spins in the fluid as they move through gradient sequences created by magnetic "gradient-coils." In the "time-of-flight" systems only bulk fluid flow is measured. Phase encoding systems require complex current-carrying "gradient" coils.

SUMMARY OF THE INVENTION

A system is described consisting of two simple components that will map in real time laminar flow in a Newtonian fluid, liquid or gaseous, detect the onset of turbulence as signal dropout in that portion of the regimen of flow so affected; and, with conventional measuring devices, permit the continuous monitoring of flow rate viscosity, viscous shear, mean free path in gaseous fluids, and the absolute temperature.

Weak oscillating gradients are used to provide spatial encoding, as described in the references cited, and the signal is received by a conventional r.f. receiver coil. The apparatus described in EPA 91303511.9 (Kang) is used for illustration, but other prior art radio frequency receiver coils, as shown in U.S. Pat. No. 4,952,878 (Mens) and Hayes, Journal of Magnetic Resonance 63, 622–628 (1985) may be used if properly matched through an isolating and matching coupler circuit, as is well known in the art (Cho, p. 264).

The received radio frequency signal from the coil and the output of the master system radio frequency oscillator are both fed to a conventional synchronous double balanced demodulator which eliminates the Larmor radio frequency carrier. The output is then the periodic envelope of the radiofrequency carrier. This envelope is a periodic function composed of integral harmonics of the frequency of the oscillating gradient.

The output from the first synchronous double balanced demodulator is fed through an isolation amplifier to a bank of identical double balanced demodulators, each of which also receives one of the integral harmonics of the oscillating gradient control amplifier.

The integrated output of each of these multiple synchronous double balanced demodulators (the "D.C. term") is the detected amplitude of each of the integral harmonic components of the carrier.

Each of these harmonic amplitudes is continuously digitalized and fed to a computer where a matrix equation approximating the linear transformation defining the transverse magnetization $$M_T = \int_{-R}^{+R} M_{(x,y)} e^{j(\omega_0 + \frac{\gamma G}{\Omega} r \sin \Omega) t} dr$$

is continuously inverted to yield the image projection along the oscillating gradient axis.

Accordingly, it is an object of the invention to provide an MRI apparatus which overcomes these as well as other problems in the prior art.

It is an object of the present invention to provide an apparatus which can produce linear magnetic field gradients.

It is also an object of the present invention to provide an apparatus that produces magnetic field gradients by generating time varying electric fields.

It is a further object of the present invention to provide an apparatus which generates a "real-time" image of an object.

It is another object of the present invention to provide an apparatus which generates an image of an object by projection reconstruction techniques.

It is yet another object of the present invention to provide an MRI apparatus that can generate an image without having to rely upon the two or three dimensional Fourier transformation but which uses alternate methods of processing signals detected from an object.

It is yet a further object of the present invention to provide an apparatus for generating magnetic field gradients which is useful in spectroscopy as well as in other applications involving magnetic resonance.

To achieve the foregoing and other objects, in accordance with the present invention, as embodied and broadly described herein, the apparatus of the present invention comprises a magnet system or other conventional system for generating a homogeneous magnetic field directed along the z axis. A plurality of wires are arranged parallel to each other along the z axis in a typical "bird cage" or "squirrel cage" configuration which is tuned near the Larmor frequency $\omega_o$.

A circularly polarized RF field centered near the Larmor frequency $\omega_o$ is generated so that it rotates about the wire conductors. A sinusoidal voltage source having a temporal frequency $\omega_p$, which is much less than the Larmor frequency $\omega_o$, is sequentially applied as a spatial cylindrical harmonic across diametrically opposed wire conductors at an angular spatial frequency of $\omega_s$, where $\omega_s$ is very much less than the frequencies $\omega_o$ and $\omega_p$.

The electric current density that is generated by the voltage source of frequency wp produces a magnetic field in the object that alters the phase of each spin in a periodic and spatially ordered field. The transverse magnetization $\overline{MT}$ of the nuclei produces an RF signal that is detected by the wire conductors and is then supplied to a control device for signal processing.

The control device can analyze the signal as a high signal to noise rapidly repeated continuous analytic function at the origin of the complex "K" plane by analytic continuation. Also, the control device may analyze the received signals as a continuous set of rapidly rotating views of the sum of the transverse magnetization $\overline{MT}$ by projection reconstruction. The determination of the spatial distribution of the transverse magnetization $\overline{MT}$ may be performed with Bessel functions or with the solution to Sommerfeld's integral, both of which allow the use of look up tables.

The invention can therefore generate the necessary magnetic field gradients by applying time varying electric fields to an RF coil assembly. Thus, the conventional "gradient coils" are no longer a necessity in the formation of images with an MRI apparatus. However, the apparatus of the present invention does not necessarily eliminate the conventional gradient coils since the application of the time varying electric fields may be used in conjunction with the conventional gradient coils. For instance, the gradient fields produced by the electric fields may be used to dephase or enhance some of the phase encoding generated with the conventional gradient coils. As a result of this, the image generated by the MRI apparatus can be made more narrow and thus the apparatus can focus in on a particular region of interest and block out all other regions.

Additional objects, advantages and novel features of the invention will be set forth in the description which follows, and will become apparent to those skilled in the art upon reading this description or practicing the invention. The objects and advantages of the invention may be realized and attained by the appended claims.

BRIEF DESCRIPTION OF THE DRAWINGS

The accompanying drawings, which are incorporated in, and form a part of, the specification, illustrate some embodiments of the present invention and, together with the description, serve to explain the principles of the invention. In the drawings:

FIG. 7 contains a perspective view of a device according to a further embodiment of the invention and a plot of fluid flow illustrating magnetized portions of the flow; and FIG. 8 is a block diagram of a receiving apparatus according to a preferred embodiment of the invention.

DESCRIPTION OF THE PREFERRED EMBODIMENTS

Figure 1:
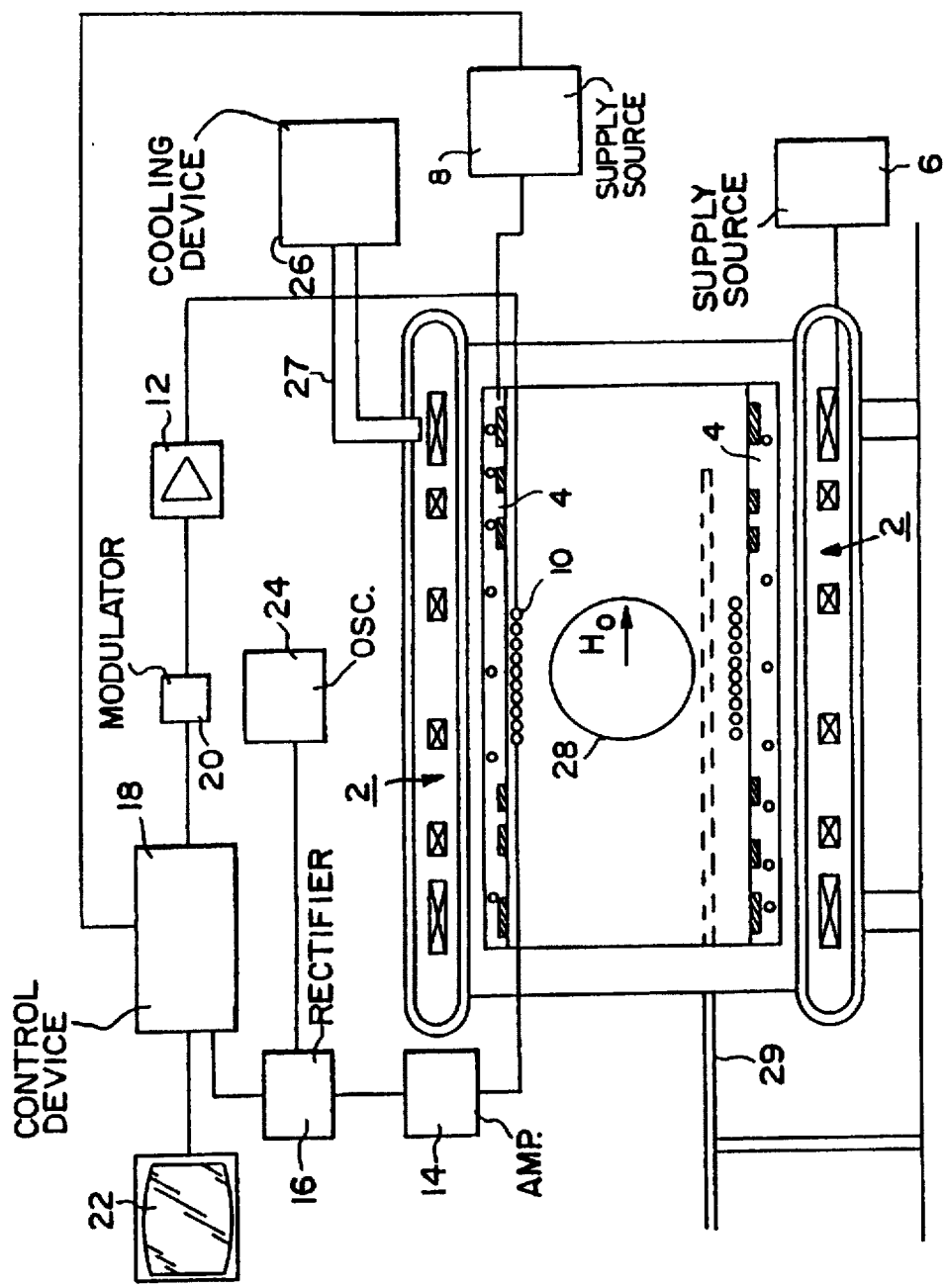
FIG. 1 is a block diagram of an embodiment of a prior art MRI apparatus.

The Radon projection of the transverse magnetization $M_T$ taken along the direction $\ominus$ of the oscillating gradient is $$M_T = \int_{-R}^{+R} M_{T_{(x,y,z)}} e^{j(\omega_o + \frac{\gamma G(r,t)}{\Omega} r \sin\Omega) + } dr \quad (1)$$

where $$r = x\cos\ominus + y\sin\ominus \quad -R \leq r \leq +R$$

and R is the radius of the sample volume (Mansfield and Morris p. 135, Shenberg and Macovski, Wollin U.S. Pat. No. 5,412,322).

Taking the Fourier transform of (1) and integrating in the complex Gaussian plane yields $$F(M_T) = \int_{-R}^{+R} M_{T_{(r)}} Z_p \left( \frac{\gamma G}{\Omega} r \right) dr \quad (2)$$

$$\text{or } F(M_T) = \int_{-R}^{+R} M_{T_{(r)}} J_n \left( \frac{\gamma G}{\Omega} r \right) dr \quad (3)$$

where n is the integral order of the Bessel function J.

The output of the receiver coil is, then, an impulse spectrum centered at the Larmar frequency consisting of sidebands whose amplitude is given by equation (3).

In the time domain the output signal $V_o$ from the r.f. receiver coil can be written as $$V_o = \sum_{n=-\infty}^{+\infty} V_n \quad (4)$$

$$\text{where } V_n = A \int_{-R}^{+R} M_{T_{(r)}} J_n \left( \frac{\gamma G}{\Omega} \right) r dr [\cos(\omega_o + n\Omega)t] \quad (5)$$

Synchronous demodulation multiplies $V_o$ by the odd harmonics of $\omega_o$ and filters out the r.f. portion of this product yielding the envelope $V_E$ $$V_E = \sum_{n=-\infty}^{+\infty} V_{E_n} \quad (6)$$

$$\text{where } V_{E_n} = A \int_{-R}^{+R} M_{T_{(r)}} J_n \left( \frac{\gamma G}{\Omega} r \right) [\cos n\Omega t] dr \quad (7)$$

Synchronous detection for each value of n yields $$|V_{E_n}| = \int_{-R}^{+R} M_{T_{(r)}} J_n \left( \frac{\gamma G}{\Omega} r \right) dr$$

which is an integral transformation that can be approximated by a linear transformation given by the matrix equation $$[|V_{E_n}|]_{0 \leq n \leq m} = \left[ J_n \left[ \left( \frac{\gamma G}{\Omega} \right) r \right] \right]_{n,r} \times [AM_{T_{(r)}}]_{-R \leq r \leq +R}$$

The first column matrix is measured by the demodulation and detection apparatus. The second square matrix is known for all n and r from tables of Bessel functions solving by Cramer's rule, or other methods, in the computer yields the third column matrix, which is the projection of the transverse magnetization along the gradient direction r.

Rotating the projection angle $\ominus$ permits acquisition of multiple projections permitting reconstruction of the distribution of the transverse magnetization, which is the desired image.

A block diagram, showing circuitry for accomplishing the desired demodulation and detection analysis is illustrated in FIG. 8.

Other methods of image reconstruction other than project transformation are well known (Cho) and may be utilised.

Reference will now be made in detail to the preferred embodiments of the invention, examples of which are illustrated in the accompanying drawings.

Figure 4:
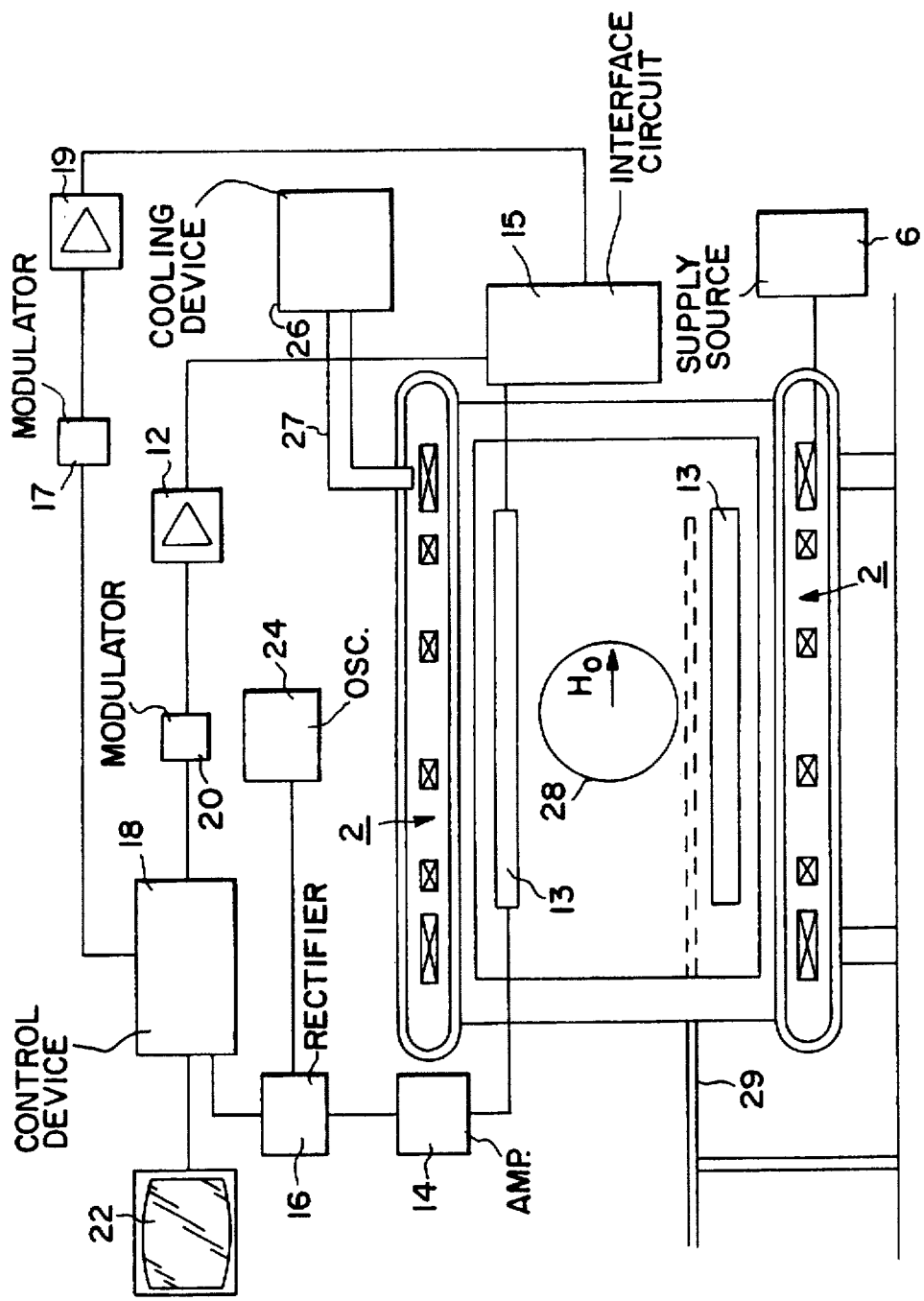
FIG. 4 is a block diagram of a first embodiment of the invention.

With reference to FIG. 4, an MRI apparatus of the invention comprises a magnet system 2 for generating a homogeneous stationary magnetic field Ho and a supply source 6 for supplying the magnet system 2 with operating power. The magnet system 2 may be of the superconducting type which requires a connection to a cooling device 26 through a cooling duct 27. The invention, however, is not limited to this specific type of magnet system 2 and other types of magnet systems 2, such as permanent magnets or resistive nonpermanent magnets, may alternatively be used.

A phase-sensitive rectifier 16 receives a signal from an oscillator 24 and supplies an output to a control device 18. The control device 18, together with a modulator 20 which is under the control of the control device 18, produces a signal modulated near the Larmor frequency $\omega_o$ which is amplified with an RF amplifier 12 and then supplied to an interface circuit 15.

Figure 2:
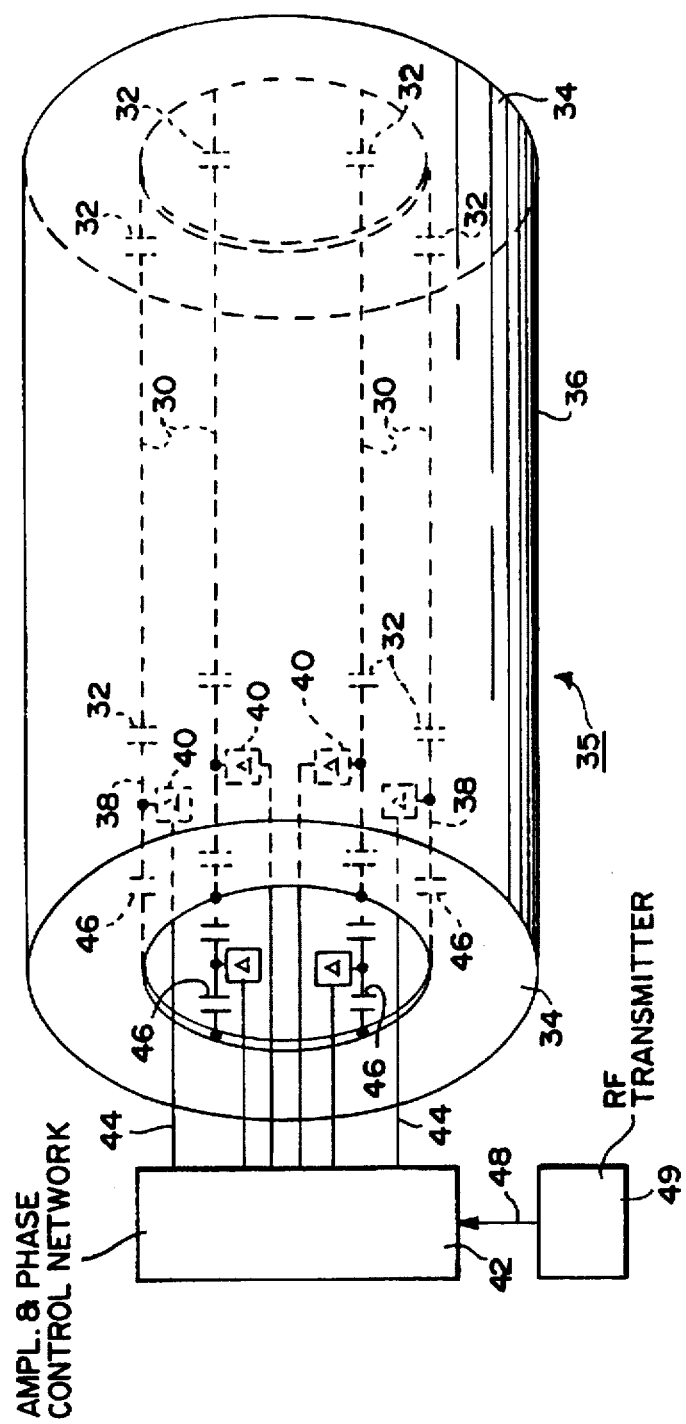
FIG. 2 is a prior art RF coil assembly.
Figure 3:
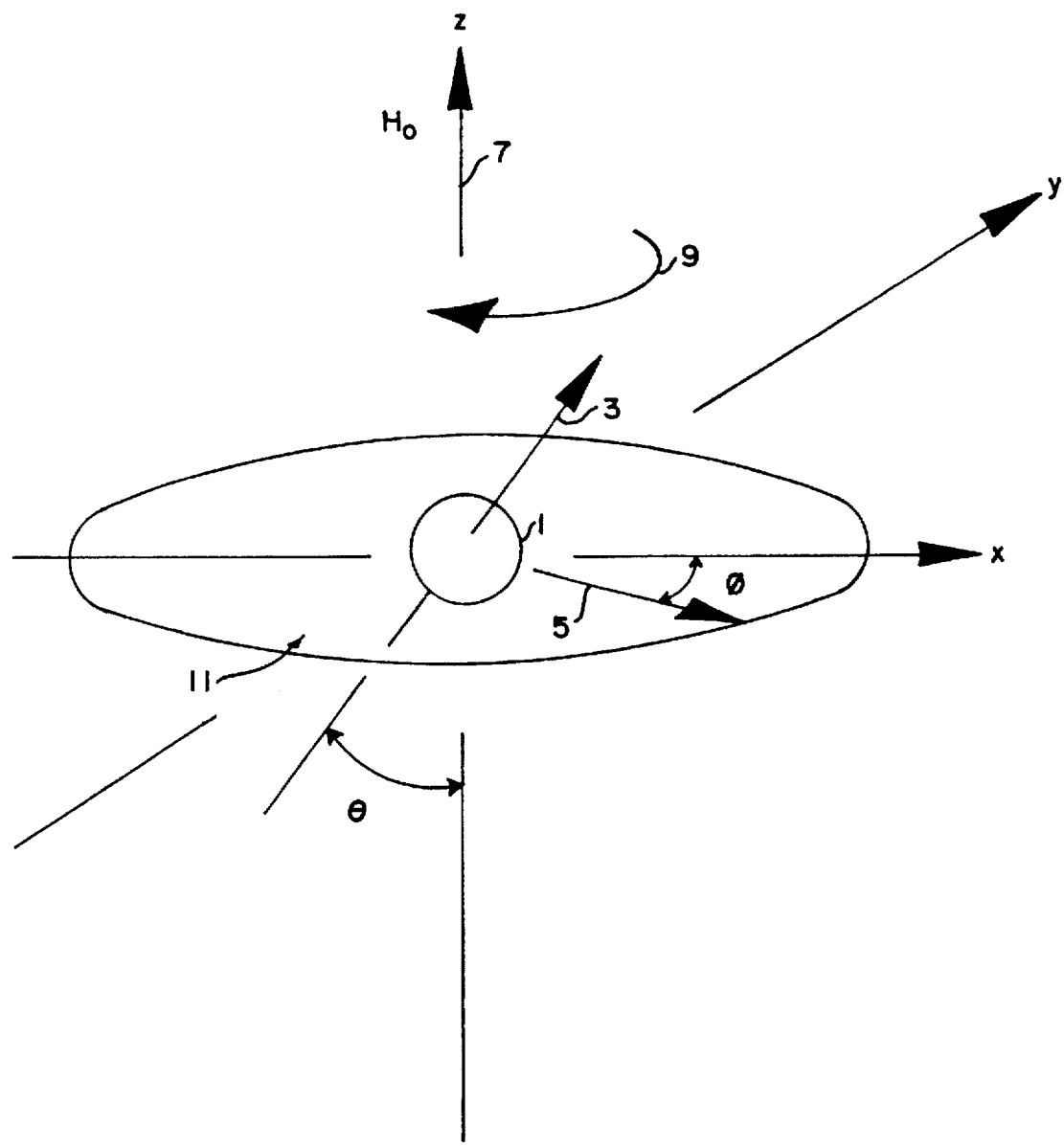
FIG. 3 is a perspective representation of a precessing nuclear spin.

The interface circuit 15 may comprise an amplitude and phase control network 42 such as that illustrated in FIG. 2. The interface circuit 15 individually controls the voltages applied to each of a plurality of wires 30 forming part of an RF coil assembly 13. Preferably, the interface circuit 15 generates a circularly polarized RF field having a frequency centered near the Larmor frequency $\omega_o$ and which rotates over the wires 30 of the RF coil assembly 13. The control device 18, together with a second modulator 17 controlled by the control device 18 produces a sinusoidal voltage at a frequency of $\omega_p$. This signal is amplified by a low frequency amplifier 19 before being supplied to the interface circuit 15. The interface circuit 15 comprises circuitry 50, shown in diagrammatical form in FIG. 5, for generating electric fields from the sinusoidal voltage. The circuitry 50 comprises a polyphase synchro generator 52 for receiving across its terminals the voltage source $V_P$, which is preferably a sinusoidal voltage signal equal to $V_P \sin(\omega_p t)$. The polyphase synchro generator 52 rotates at a frequency of $\omega_s$ and successively applies the voltage signal $V_P$ to each pair of opposed conductor wires 30 as a spatial cylindrical harmonic function of the rotating frequency $\omega_s$ of the primary winding illustrated in FIG. 5.

The coil assembly 13 having the opposed wires 30 may be formed in the conventional "bird cage" or "squirrel cage" configuration, such as that illustrated in FIG. 2. The coil assembly is tuned near the Larmor frequency $\omega_o$ so that the circularly polarized RF field generated near the Larmor frequency $\omega_o$ can rotate about the wires 30. A first set of isolation filters $Z_1$ are for filtering out the circularly polarized voltages generated near the Larmor frequency $\omega_o$ and are connected between the wires 30 and contact points for the polyphase synchro generator 52. Another set of filters $Z_3$ are connected between the wires 30 on one ring conductor 34 of the coil assembly 13. These filters $Z_3$ tune the coil assembly 13 near the Larmor frequency $\omega_o$ so that voltages near the Larmor frequency may rotate about the coil assembly 13 and also prevent other signals, such as the voltage signal $V_P$, from rotating about the coil assembly 13.

The Larmor frequency $\omega_o$, the frequency up of the voltage signal VP, and the frequency $\omega_S$ at which the polyphase synchro generator rotates, are selected such that:

$$\omega_o > \omega_p > \omega_S \qquad \text{EQ. (15)}$$

The electromechanical polyphase synchro generator configuration 52 is diagrammatic only and is preferably comprised of solid state circuitry. For instance, the polyphase synchro generator 52 may be replaced with an amplitude and phase control network and a voltage divider network that produces a spatial cylindrical harmonic array of sinusoidal voltages having a temporal frequency of $\omega_p$. The voltage divider network may then periodically apply the array of sinusoidal voltages to opposed wire conductors 30 at the angular spatial frequency of $\omega_S$. These voltages are periodically applied over a spatial angle $\alpha$, where:

$$\alpha = \omega_S t \qquad \text{EQ. (16)}$$

Besides using the coil assembly 13 to transmit electromagnetic fields that have frequencies of $\omega_o$ and $\omega_p$, the coil assembly 13 is also preferably used as a receiver to detect RF signals emitted by the nuclei in an object to be imaged. The signals detected with the RF coil assembly 13 are passed through a set of filters $Z_2$ for filtering out unwanted frequencies and unwanted signals, such as those intended for excitation or phase modulation. The detected signals are amplified with an RF amplifier 14, rectified with rectifier 16, and then processed in the control device 18 in order to construct an image of the object which is displayed on a monitor 22.

Figure 5:
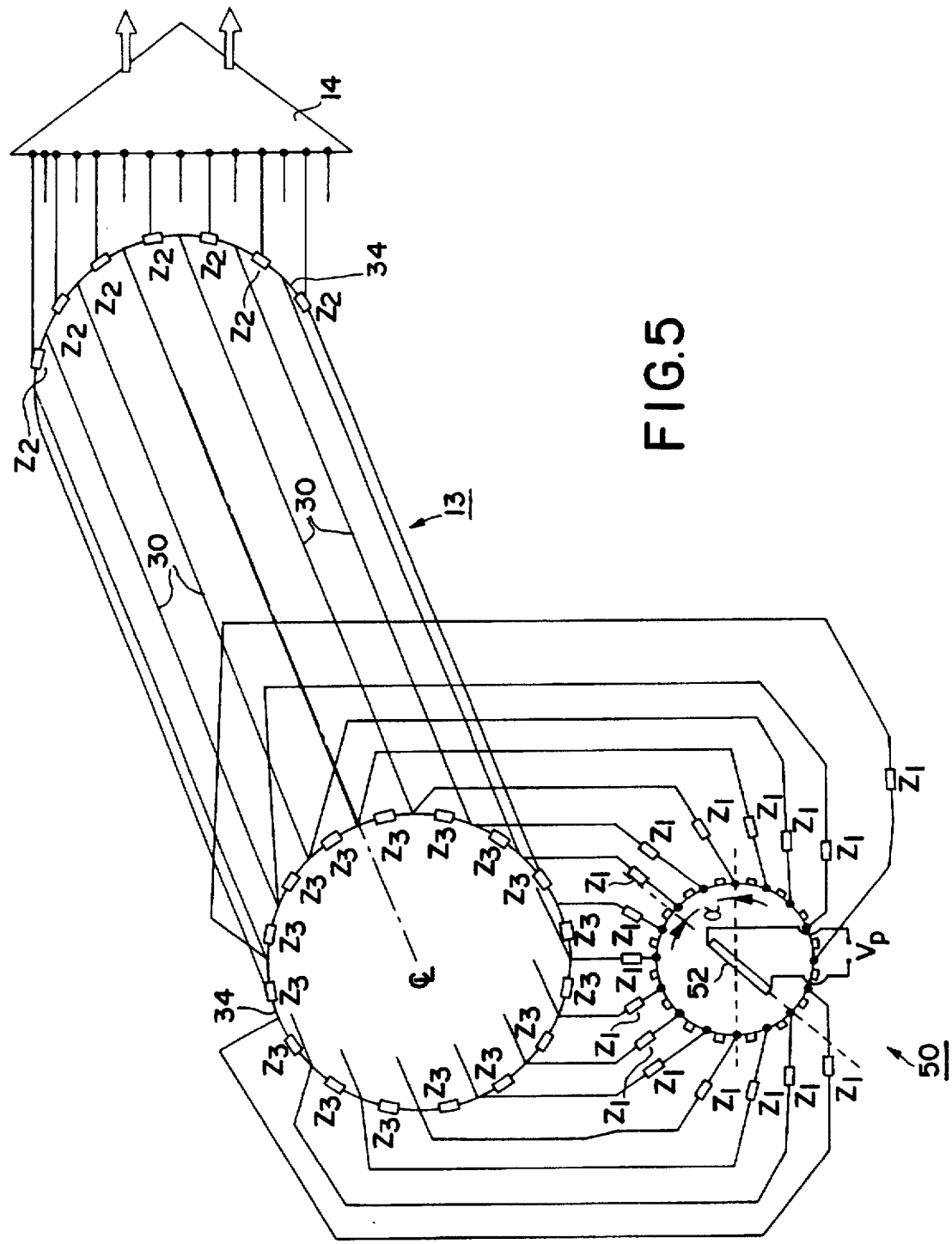
FIG. 5 is an exemplary diagram of the circuitry used for generating the magnetic field gradients by way of electric fields.

The embodiment illustrated in FIGS. 4 and 5 does not contain the conventional "gradient coils," such as the gradient coils 4 in FIG. 1. Instead, the embodiment employs an RF coil assembly 13 for transmitting the RF excitation and for also creating the magnetic field gradients. The manner in which these gradients are produced and the manner in which the detected signals are processed will now be presented in more detail below.

As shown by Equation 17, the gradient field $\overline{G}$ is defined to be the gradient of the z component $h_z$ of the magnetic field $\overline{H}$.

$$\overline{G} \triangleq \nabla h_z \qquad \text{EQ (17)}$$

As a result, with reference below to Equations 18 and 19, the curl of the gradient field $\overline{G}$ must be equal to zero and, using Stokes theorem, the closed line integral of the gradient field $\overline{G}$ must also be equal to zero. Although the curl of the gradient field $\overline{G}$ is equal to zero, the curl of the magnetic field $\overline{H}$ is not equal to zero.

$$\nabla \times \overline{G} = 0, \text{ (but } \nabla \times \overline{H} \neq 0) \qquad \text{EQ. (18)}$$

and $$\oint \overline{G} \cdot d\overline{L} = 0 \qquad \text{EQ. (19)}$$

where, in a Cartesian system of coordinates, the differential path element $d\overline{L}$ is defined as:

$$d\overline{L} = \bar{i}dx + \bar{j}dy + \bar{k}dz \qquad \text{EQ. (20)}$$

Therefore, the relationship between the z component $h_z$ of the applied magnetic field H and the gradient field $\overline{G}$ is as follows:

$$\int_0^x \int_0^y \int_0^z \overline{G} \cdot d\overline{L} = h_{z(x,y,z)}, \qquad \text{EQ. (21)}$$

and, assuming cylindrical symmetry, $$\frac{\partial h_x}{\partial z} = \frac{\partial h_y}{\partial z} = \frac{\partial h_z}{\partial z} = 0, \qquad \text{EQ. (22)}$$

Whereby one may conclude that the relationship between the gradient field G and the magnetic field $\overline{H}$ is as follows:

$$\overline{G} = \overline{k} = \times (\nabla \times \overline{H}) \qquad \text{EQ. (23)}$$

The relationship between the z component $h_z$ of the magnetic field $\overline{H}$ and the applied electric field $\overline{E}$ may also be determined. From the Maxell-Ampere equation, it is known that the current density $\overline{J}$ is equal to the curl of the magnetic field $\overline{H}$.

$$\nabla \times \overline{H} = \overline{J} \qquad \text{EQ. (24)}$$

As shown in Equation 25, the total current density $\overline{J}_T$ is comprised of a number of components.

$$\overline{J}_T = \overline{J}_x + j\overline{J}_z = \overline{J}_i + \overline{J}_{ie}\overline{J}_{de} \qquad \text{EQ. (25)};$$

where:

$\overline{J}_i$ impressed (source) electric current density;

$\overline{J}_{ie}$ = effective conductive electric current density
$= (\sigma_S + \omega_p \epsilon'')\overline{E};$ \qquad EQ. (26)

$\overline{J}_{dc}$ = effective displacement electric current density;

$= j\omega_p \epsilon' \overline{E};$ \qquad EQ. (27)

$\epsilon$ = the complex permittivity $\epsilon$ of the medium;

$= \epsilon' - j\epsilon'';$ \qquad EQ. (28)

and $\sigma_S$ = the static conductivity.

An electric field E is defined complex time-harmonic terms as follows:

$$E = \overline{E}e^{j\omega_p t} \qquad \text{EQ. (29)};$$

$$\overline{E} = \overline{E}_x + j\overline{E}_y \qquad \text{EQ. (30)}$$

Assuming a source free region, the impressed electric current density $\overline{J}_1$ is zero and the total current density $\overline{J}_T$ is reduced to the form:

$$\overline{J}_T = 0 + (\sigma_s + \omega_p \epsilon'' + j\omega_p \epsilon')\overline{E} \qquad \text{EQ. (31)}$$

The total current density $\overline{J}_T$ expressed in more general terms is as follows:

$$\overline{J}_T \triangleq C(\omega_p) \overline{E} \triangleq |C| e^{j \neq \overline{E}} \qquad \text{EQ. (32)}$$

By using the relationship between the gradient $\overline{G}$ and the z component $h_z$ of the magnetic field $\overline{H}$ (Equation 21) and the relationship between the gradient field $\overline{G}$ and the magnetic field (Equation 23), the z component $h_z$ of the magnetic field $\overline{H}$ may be expressed in terms of the electric field $\overline{E}$ by the following equation:

$$h_{z(x,y)} = \omega_p j (\omega_p t + \neq) (\int_o {}^y \overline{E}_x dy - \int_o {}^x \overline{E}_y dx) \qquad \text{EQ. (33)}$$

Thus, the z component $h_z$ of the magnetic field $\overline{H}$, which defines the gradient field $\overline{G}$, may be generated by applying electric fields to the object. The relationship between the desired z component $h_z$ and the electric field $\bar{E}$, and thus the relationship between the gradient field $\bar{G}$ and the electric field $\bar{E}$, is determined by Equation 33.

To aid in the understanding of this relationship, consider a uniform electric field $\bar{E}$ produced by a voltage V applied across two large conducting plates. The two conducting plates are perpendicular to the x axis, parallel to the z axis, and are separated by a distance D. The components of the electric fields produced by this voltage V are then determined according to the following equations:

$$E_x=\frac{V}{D}; E_y=0 \qquad (34)$$

Integrating Equation 12 to solve for the phase $\phi$ as a function of time, yields the following equation:

$$\phi_{(t)}=\int_o^t \gamma(H_o+h_z)\,dt \qquad EQ.\ (35)$$

Then, substituting the value of the z component $h_z$ of the magnetic field H from Equation 33 and solving yields the following in time-harmonic form:

$$\phi_{(t,y)}=\gamma H_o t + y\frac{\gamma CV}{j\omega_p D}\,e^{j(\omega_p t+\psi)} \qquad EQ.\ (36)$$

or, in real-time form:

$$\phi_{(t)}=\gamma H_o t + y\frac{\gamma CV}{\omega_p D}\sin(\omega_p t+\psi). \qquad EQ.\ (37)$$

Since the transverse flux density $\bar{B}_T$ produced by each element in the object having an area of dxdy in the complex x,jy plane is known to be:

$$B_{T(x,y,c)}=\mu_0 M_{T(x,y)}e^{j\phi(y,c)} \qquad EQ.\ (38)$$

the voltage induced in the coil assembly 13 by each element of dxdy is:

$$dv_{o(t)}=f_{(x,y)}\left(\mu_0 M_{T(x,y)}e^{j\phi}\frac{d\phi}{dt}\right)dxdy$$

Integrating this equation and solving for the induced voltage yields:

$$v_o(t)=\int_{-D/2}^{+D/2}\left(\int_{-D/2}^{+D/2}f_{(x,y)}\mu_0 M_{T(x,y)}dx\right) \qquad EQ.\ (40)$$

$$\left(je^{j\phi}\frac{d\phi}{dt}\right)dy\Delta \int_{-D/2}^{+D/2}A_{(y)}B_{(y,t)}dy.$$

In Equation 40, $v_o(t)$ is the output voltage detected by the coil assembly 13 which is analyzed by the control device 18. The element $B_{(y,t)}$ in Equation 40 is a phase modulating function of space and time which is also determined by the control device 18. Since $v_o(t)$ and $B_{(y,t)}$ are known variables, Equation 40 may be solved to determine element $A_{(y)}$ and thus the projection of the transverse magnetization $\bar{M}_T$.

This yields one view of a projection-reconstruction of the image. If Equation 40 is subject to a complex spatial transformation, such as the Fourier transformation, an analytic continuous segment in the complex "K" plane may be determined.

Up to this point, the transverse magnetization $\bar{M}_T$ has been determined as if the electric fields have been generated from two parallel conducting plates. Since the embodiment of FIG. 4 has a plurality of wires 30, each pair of opposed wires 30 will approximate a pair of conducting plates for an infinitesimal element in the object. By performing a conformal transformation, which is within the skill of one of ordinary skill in the art, the generalized orthogonal rectilinear space is transformed through the Cauchy-Reimann condition equations to an orthogonal curvilinear space so that the phase encoding electric field $\bar{E}$ may be produced by an array of conductors arranged parallel to the z axis around the periphery of the object to be imaged. The spatial address of each element $\bar{M}_T$ is also subjected to the same conformal transformation. The purpose of the conformal transformation is to translate the relationships defined by two parallel plate conductors M orthogonal rectilinear space to the relationships which exist in the embodiment of FIG. 4 orthogonal curvilinear space.

Next, by slowly rotating the voltage source $V_p$ about the wires 30 at the spatial angle of $\alpha$, a continuous set of views for projection reconstruction are generated. Each view is the average of a number of images in time so that the signal to noise ratio is thereby improved. The rotation of the voltage source $V_p$ may also be visualized as generating an "n-leaved rose" pattern of closely spaced lines centered at the origin of the complex "K" plane.

The spatial distribution of $\bar{M}_T$ may be continuously computed to thereby form a virtual "real-time" image while simultaneously applying RF energy to or receiving RF energy from the object to be imaged.

An alternate manner of determining the transverse magnetization $\bar{M}_T$ involves the use of Bessel functions. Turning back to the parallel conducting plates analysis, the phase $\phi$ as a function of time may be expressed by the following equation:

$$\phi_{(y,t)}=\int_0^t \gamma(H_o+h_z)\,dt. \qquad EQ.\ (41)$$

After substituting in the expression for the z component $h_z$ of the magnetic field $\bar{H}$, the phase function $\phi$ may be expressed in real time as:

$$\phi=\gamma H_o t + y(\gamma)(C)\left(\frac{V}{D}\right)\left(\frac{1}{\omega_p}\right)\sin(\omega_p t). \qquad EQ.\ (42)$$

Also, the transverse magnetic flux density BT is known to be equal to:

$$B_{T(x,y,c)}=\mu_0 M_{T(x,y)}e^{j\phi(y,c)} \qquad EQ.\ (43).$$

If a coil is placed in the x-z plane, a voltage v(t) will be induced in the coil which is equal to:

$$v(t)=\int_{-D/2}^{+D/2}\left(\int_{-D/2}^{+D/2}f_{(x,y)}\mu_0 M_{T(x,y)}dx\right)\left(\frac{d}{dt}\sin\phi\right)dy. \qquad EQ.\ (44)$$

Since Equation 42 provides an expression for $\phi$, $\sin\phi$ in Equation 44 may be expanded to equal:

$$\sin\phi=\sin(\omega_o t+Ay\sin\omega_p t) \qquad EQ.\ (45).$$

In Equation 45, the variable A and $\omega_o$ are defined to be:

$$A\triangleq\frac{\gamma CV}{D\omega_p}\,;\,\omega_o\triangleq\gamma H_o. \qquad EQ.\ (46)$$

Using Bessel functions, the expression $\sin\phi$ may be expressed as:

$$\sin\phi = J_o(Ay)\sin(\omega_o t) + \quad \text{EQ. (47)}$$

$$\sum_{n=0}^{\infty} J_n(Ay)[(-1)^{n+1}\sin(\omega_o + n\omega_p)t +$$

$$(-1)^n\sin(\omega_o - n\omega_p)t];$$

and $$\frac{(d\sin\phi)}{dt} = \omega_o J_o(Ay)\cos(\omega_o t) + \quad \text{EQ. (48)}$$

$$\sum_{n=0}^{\infty} J_n(Ay)[(-1)^{n+1}(\omega_o + n\omega_p) \cdot$$

$$\cos(\omega_o + n\omega_p)t + (-1)^n(\omega_o - n\omega_p)\cos(\omega_o - n\omega_p)t].$$

In conventional systems, a free induction decay signal is produced by broadening the absorption line by a conventional gradient coil. The free induction decay signal is the Fourier coefficient of the transverse magnetization $\overline{M}_T$ projected perpendicular to the gradient. In contrast, with the embodiment of FIG. 4, an electric field $\overline{E}$ modulates the phase increment to produce a line spectrum centered at the Larmor frequency. The amplitudes of the line spectrum are equal to the integral of the projection of $\overline{M}_T$ taken along the electric field $\overline{E}$ weighted by a Bessel function whose order is the order of each harmonic and whose argument is proportional to the position of each element of the projection along the gradient perpendicular to the electric field $\overline{E}$.

For each harmonic n in the line spectrum, the sum of the upper and lower sideband voltage output detected by the coil assembly is equal to:

$$|V_n| = \int_{-D/2}^{+D/2} P_{(y,n)} J_n(Ay) dy. \quad \text{EQ. (49)}$$

where:

$$P_{(y,n)} = 2\mu_o n\omega_p \int_{-D/2}^{+D/2} f_{(x,y,n)} M_{T_{(x,y)}} dx. \quad \text{EQ. (49a)}$$

The projection of the transverse magnetization $\overline{M}_T$ may be determined from Equations 49 and 49a. Once the projection of the transverse magnetization $\overline{M}_T$ has been determined, it is within the capability of one of ordinary skill in the art to generate an image of the object.

A third manner in which the control device 18 may process the detected signals and generate an image of an object is through the use of Sommerfeld's integral. The transverse magnetic field density $\overline{B}_T$, which is low density detected by the coil assembly 13, is equal to:

$$B_{T_{(t)}} = \mu_o e^{j\omega_o t} \int_{-D/2}^{+D/2} M_{T_{(y)}} e^{-jAy\sin\omega_p t} dy. \quad \text{EQ. (53)}$$

Taking the Fourier transform of the transverse magnetic field density $\overline{B}_T$, yields the following:

$$G(\omega) = \int_{-\infty}^{+\infty} B_{T_{(t)}} e^{-j\omega t} dt = \quad \text{EQ. (54)}$$

$$\frac{\mu_o}{j\omega_p} \int_{-D/2}^{+D/2} M_{T_{(y)}} \int_{-j\infty}^{+j\infty} e^{j(\omega_o - \omega)t} \cdot e^{-jAy\sin\omega_p t} d(j\omega_p t) dy.$$

If the following variables are defined accordingly:

$$n \stackrel{\Delta}{=} \frac{(\omega_o - \omega)}{\omega_p} \; ; \rho \stackrel{\Delta}{=} Ay; \tau \stackrel{\Delta}{=} \omega_p t \quad \text{EQ. (55)}$$

then part of Equation 54 may be abbreviated to Sommerfeld's integral, as shown by the following:

$$G(\omega) = \int_{-D/2}^{+D/2} \mu_o \frac{jM_T}{\omega_p} \int_{-j\infty}^{+j\infty} e^{j(\rho\sin\tau - n\tau)} d\tau dy. \quad \text{EQ. (56)}$$

Therefore, Equation 54 can be further simplified to the form:

$$G(\omega) = \int_{-D/2}^{+D/2} \frac{j\mu_o}{\omega_p} M_{T_{(y)}} \pi Z_n (\rho) dy, \quad \text{EQ. (57)}$$

where $Z_n (\rho)$ are the solutions to Sommerfeld's integral. The frequency content of the voltage detected with coil assembly 13 will determine the variable G(w). Also, with every value of y and n, the control device 18 may determine a value of $Z_n(\rho)$ by using well known tables and methods to the various solutions of Sommerfeld's integral. Accordingly, the transverse magnetization $\overline{M}_T$ can be determined and an image of the object can be generated.

Figure 6:
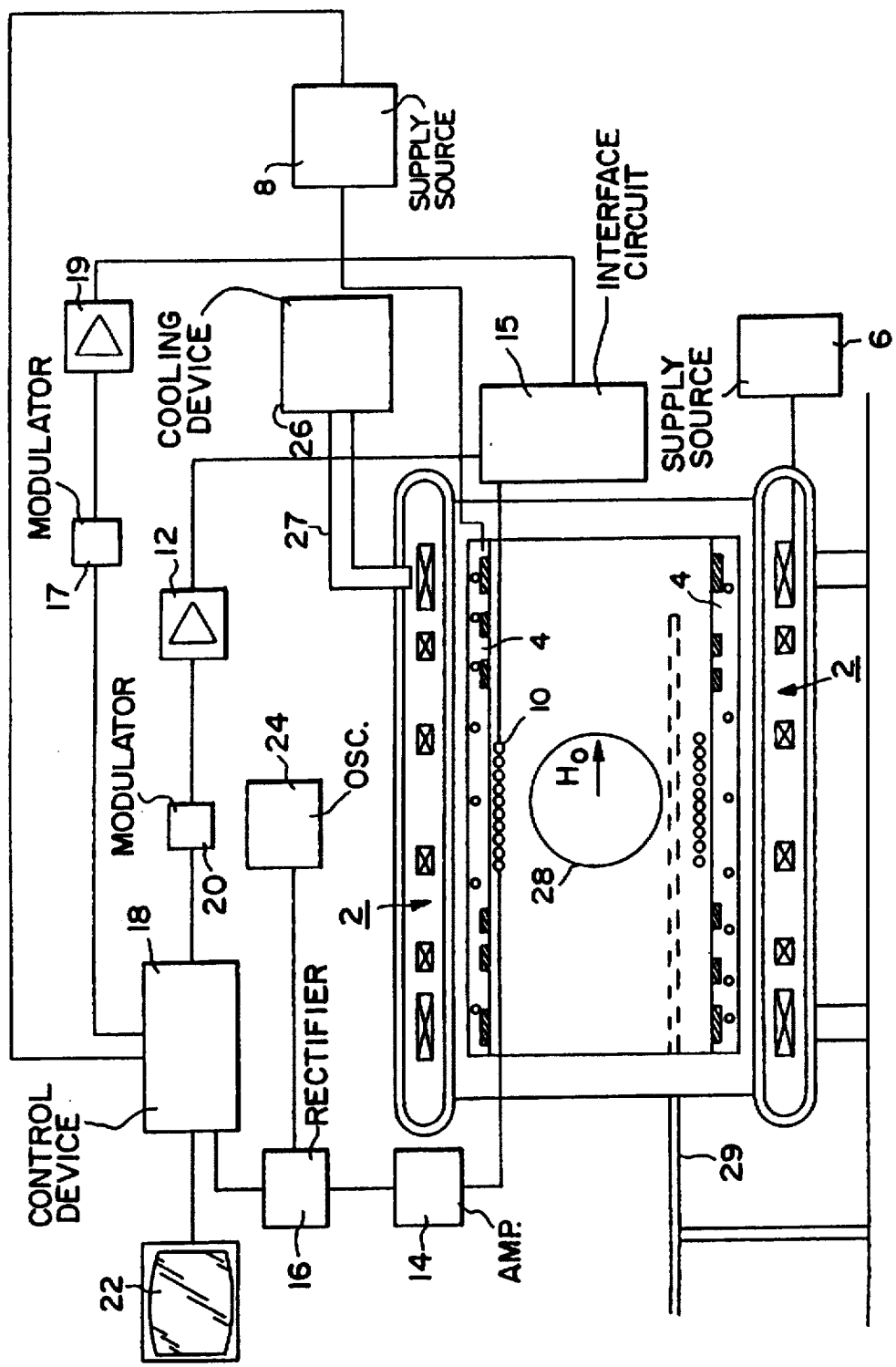
FIG. 6 is a second embodiment of the MRI apparatus of the present invention.

Another embodiment of the invention is illustrated in FIG. 6. As shown in this figure, the MRI apparatus comprises a conventional set of gradient coils 4 and a supply source 8 for generating gradient fields. The MRI apparatus further comprises the circuitry shown in FIG. 4 of the invention, which generates gradient fields by using electric fields. The MRI apparatus of FIG. 6, like the embodiment of FIG. 4, also comprises an interface circuit 15, a modulator 17, and an RF amplifier 19.

The gradient fields produced by the electric fields may be used in the embodiment of FIG. 6 to enhance or dephase some of the gradient fields generated by the conventional gradient coils. This may be advantageous in applications where an image is desired of only a small region of the object. The gradient fields produced by the electric fields would combine with the gradient fields produced by the conventional gradient coils with the resultant gradient fields affecting only that small region in the object. Thus, a more narrow image of the object is produced which reveals only that small desired portion of the object and which deletes all other portions of the object.

The RF coil assembly 13 may also be used to correct for inhomogeneities of the complex dielectric constant and also to correct for anisotropy. These errors may result from an inhomogeneous complex dielectric constant in the object that shifts the "gradient" horizontally in opposite directions, depending upon the polarity of the applied electric field. Thus, the inhomogeneous complex dielectrics distort the magnetic field gradients produced by the RF coil assembly 13 thereby rendering the gradient fields non-linear.

To illustrate how the RF coil assembly 13 may correct these errors, first consider the expression for the phase φ, which is:

$$\phi = \gamma H_0 t + \int_0^r \int_0^t (\gamma E C \cos\omega_p t) dt dr. \quad \text{EQ. (58)}$$

Defining a first coordinate system T as being equal to r +js, a first detected phase $\phi_1$ is equal to:

$$\phi_1(t) = \frac{\gamma \sin\omega_p t}{\omega_p} E_s \int_0^r C_{(r)} dr, \quad \text{EQ. (59)}$$

where the variable $C_{(r)}$ is defined accordingly:

$$C_{(r)} \stackrel{\Delta}{=} C + \epsilon_{(r)}, \quad \text{EQ. (60)}$$

and $$c \stackrel{\Delta}{=} \frac{1}{D} \int_{-D/2}^{+D/2} C_{(r)} dr. \quad \text{EQ. (61)}$$

After substituting in the expression for $C_{(r)}$ into Equation 59, the expression for the first detected phase $\phi_1$ becomes:

$$\phi_1(t) = \frac{\gamma \sin\omega_p t}{\omega_p} E_s \left( Cr + \int_0^r \epsilon_{(r)} dr \right). \quad \text{EQ. (62)}$$

If we define a second coordinate system W as being equal to u+jv, a second detected phase $\phi_2$ is equal to:

$$\phi_2(t) = \frac{\gamma \sin\omega_p t}{\omega_p} E_v \int_0^u C_{(u)} du, \quad \text{EQ. (63)}$$

where the variable $C_{(u)}$ is defined accordingly:

$$C_{(u)} \stackrel{\Delta}{=} C + \epsilon_{(u)}, \quad \text{EQ. (64)}$$

and $$c \stackrel{\Delta}{=} \frac{1}{D} \int_{-D/2}^{D/2} C_{(u)} du. \quad \text{EQ. (65)}$$

Next, after substituting in the expression for C(U) into Equation 63, the expression for the second detected phase $\phi_2$ becomes:

$$\phi_2(t) = \frac{\gamma \sin\omega_p t}{\omega_p} E_v \left( Cu + \int_0^u \epsilon_{(u)} du \right). \quad \text{EQ. (66)}$$

If the two coordinate systems T and W are respectively defined by electric fields of opposite polarities, which occur when the applied voltages have opposite polarities, then the following variables in the two coordinate systems are interrelated according to the following expressions:

$$T\ 32\ -W;\ r=-u;\ s=-v;\ E_s=-E_v \quad \text{EQ. (67)}.$$

With Equation 66, the expression for the second detected phase $\phi_2$ may be altered to the form:

$$\phi_2(t) = \frac{\gamma \sin\omega_p t}{\omega_p} (-E_s) \left[ C(-r) + \int_0^{-r} \epsilon_{(-r)} d(-r) \right], \quad \text{EQ. (68)}$$

which reduces to the form:

$$\phi_2(t) = \frac{\gamma \sin\omega_p t}{\omega_p} (E_s) \left[ Cr - \int_0^{-r} \epsilon_{(-r)} d(-r) \right]. \quad \text{EQ. (69)}$$

Since the following equation is true:
$\epsilon = \epsilon_1 + \epsilon_2$, where $\epsilon_1$ is even and $\epsilon_2$ is odd, then $$\int_0^r \epsilon_{1_{(r)}} dr = \int_0^{-r} \epsilon_{1_{(-r)}} d(-r) \quad \text{EQ. (70a)}$$

and $$\int_0^r \epsilon_{2_{(r)}} dr = -\int_0^{-r} \epsilon_{2_{(-r)}} d(-r) \quad \text{EQ. (70b)}$$

the sum of the first detected phase $\phi_1$ with the second detected phase $\phi_2$ will be equal to:

$$\phi_1 + \phi_2 = 2(E_s) \frac{\gamma \sin\omega_p t}{\omega_p} \left[ Cr + \int_o^r \epsilon_2(r) dr \right] \quad \text{EQ. (71)}$$

which is a corrected phase signal that is not influenced by the even error signal. Also, the difference between the first detected phase $\phi_1$ and the second detected phase $\phi_2$ will equal:

$$\phi_1 - \phi_2 = 2(E_s) \frac{\gamma \sin\omega_p t}{\omega_p} \int_o^r \epsilon_{1_{(r)}} dr \quad \text{EQ. (72)}$$

which separates the odd error signal from the phase encoded signal.

By subtracting the detected signals when the applied voltages are of opposite polarity to each other, the errors caused by inhomogeneity and anisotropy in the object cancel. Since the corrected signal therefore has less distortion, the image is improved.

An advantage of the present invention is that the costly and complex gradient coils in the conventional MRI apparatus are no longer a necessity since the gradient fields may be produced by the application of a time varying voltage $V_P$ to the RF coil assembly 13. As a result of the time varying voltage $V_p$, electric fields are generated in the object and produce time varying magnetic fields that have a uniform curl. Consequently, the apparatus of the present invention produces linear magnetic field gradients.

Another advantage of the present invention is that the processing of the detected signals is not limited to the two or three dimensional truncated Fourier series or Fourier transformation. Rather, the apparatus of the present invention may process the detected signals by projection techniques and may use Bessel functions or the solution to Sommerfeld's integral in order to solve for the transverse magnetization $\overline{M}_T$.

A further advantage of the present invention is that some image artifacts are eliminated. The invention does not produce image artifacts caused by the periodic displacement of spins resulting from the interaction of their charge and mass with the applied electric field, which is a component of the complex permittivity, but is orthogonal to both the z axis and also the gradient field $\overline{G}$, since no phase dispersions are produced unless another gradient is applied along the direction of the applied electric field. Combining these gradients as in the embodiment of FIG. 6 allows selective dephasing of some of the spins in the imaging volume.

The image may also be improved with the present invention by detecting phase encoded signals when the applied voltages have opposite polarities. By summing together phase encoded signals detected when the applied voltages have opposite polarities, the error components of the signals cancel each other thereby producing a corrected phase encoded signal. The error signal may also be separated from the phase encoded signal by subtracting the two phase encoded signals. The corrected phase encoded signal, since it no longer contains the error signal, has less distortion which thereby produces an improved image of the object.

The foregoing description of the preferred embodiments of the invention has been presented for purposes of illustration and description. It is not intended to be exhaustive or to limit the invention to the precise forms disclosed. Many modifications and variations are possible in light of the above teaching.

For example, although the embodiments have been described with reference to a system that uses RF pulses, the invention is equally applicable to a continuous wave system. Further, rather than applying a voltage VP which has a constant frequency of $\omega_p$, the frequency of the applied voltage $V_p$ may vary in order to find the resonances of the dispersion of the complex dielectrics of the object and to measure complex dielectrics in the object.

Also, although the electric fields have been used to produce magnetic field gradients for the generation of an image, the electric fields may also be used to generate magnetic field gradients which function to destroy parts of an image. Thus, a more narrow image may be generated which does not reveal portions of the object which are not of interest. The technique of making an image more narrow may be used in spectroscopy to thereby make it possible to tell the number of spins of a particular species. It may also be possible to identify particular species of charged particle mobility with this technique.

Moreover, the generation of magnetic field gradients with electric fields has applications with magnetic resonance other than in just the imaging of an object. For instance, a magnetic resonance apparatus may be used to determine whether fruit is fresh, whether a chocolate bar has been frozen and then thawed, as well as a multitude of other possibilities. The invention is equally applicable to these other magnetic resonance applications.

The device consists of prior art "birdcage" coil surrounded by a conventional solenoid coil as illustrated in FIG. 7. The fluid to be measured flows through the device along the common axis of symmetry of the solenoid coil and the bird cage coil. The two coils may be arranged circumferentially about a nonconducting, nonferromagnetic pipe, or nozzle, or the solenoid coil may be placed peripheral to and the "birdcage" coil placed internal to a nonferromagnetic metallic pipe, or both coils may be placed within a ferromagnetic pipe. Alternately, the two coaxial coils may be suspended within or moved through bulk fluid. The device may include isentropic entry or exit nozzles to couple the regimen of flow within the device to the surrounding fluid flow.

The purpose of the solenoid coil is to create a strong homogeneous magnetic field $H_o$ along the axis of symmetry of the device. Alternatively, a more elaborate system of permanent magnets or superconducting magnets may be used for the same purpose.

The birdcage coil is provided with three electrically isolated sets of connection so as to permit simultaneous radiofrequency excitation of the spins at the Larmor frequency $\gamma H_o$ through a transversely $TM_{oo}$ polarized rotating $H_1$ field; the reception of sidebands above and below the Larmor frequency $\gamma H_o$; and the sequential application of a spatially ordered rotating array of low frequency $\omega_p$ phase encoding voltages to the conductor elements of the birdcage coil.

Two modes of operation are considered. In one method, the radio frequency energy is applied continuously creating a steady-state condition where the transverse magnetization varies as a known function of the velocity of flow and is continuously mapped by time varying gradients produced in the fluid by the same "birdcage" coil that creates the rotating radio frequency field and receives the signal generated by the transverse magnetization.

In another method, the radiofrequency field is repetitively pulsed to excite "flip" the spins. Images are obtained between the pulses as flow replaces spins with coherent transverse magnetization by those without coherent transverse magnetization.

In the first, a short conventional pulse is applied to "flip" the spins conventional transversely so that they induce a signal in the "birdcage" coil. After the pulse, unmagnetized fluid replaces the magnetized fluid across a parabolic wave front so that the magnetization becomes a temporal function of the radius of each concentric element of laminar flow, as governed by Poiseuille's equation. This produces a radially ordered distribution of transverse magnetization whose intensity is a radial function of flow velocity. The time varying signal is radially phase encoded by the curl of the polarization vector produced in the fluid by the electric field generated by the spatially ordered slowly rotating array of voltages of temporal frequency wp applied to the conducting elements of the birdcage coil, as described in the basic patent.

In the second mode the radiofrequency $H_1$ field is applied continuously. This produces a cylindrically symmetrical radially undulating intensity of transverse magnetization which is spatially phase encoded and detected as in the basic patent.

The mathematical description of the magnetization is relatively simple, using customary assumptions, but expansion in closed form contains numerous terms, many of which become insignificant with the appropriate selection of system parameters. (See Appendix 1.) The mathematical development demonstrates that the function describing the time-course of the radially varying cylindrically symmetrical transverse magnetization is real, single-valued, continuous, and limited in magnitude. It is phase modulated by the time-varying gradients of temporal frequency $\omega_p$ produced by the curl of the polarization vector created in the fluid by the electric field generated by the spatially ordered slowly rotating array of voltages applied to the conductors of the "birdcage" coil. The detected signal consists of a series of upper and lower discrete sidebands spaced by multiples of $\omega_p$ above and below the Larmor frequency, analogous to conventional frequency or phase modulation in radio communication.

At velocities above Reynolds numbers of about 2100 turbulence develops. The turbulence creates spatial and temporal disorder in the magnetization vector producing signal dropout, marking the boundary between laminar flow and turbulent flow.

Assume laminar flow of a non-compressible Newtonian fluid in a cylindrical nozzle of radius R and length L. A solenoidal coil is placed peripheral to this volume to create a nearly uniform magnetic field along the z axis. Steady state non-turbulent fluid flow occurs in concentric lamellae of radius r according to Poiseuille's equation:

$$V_{(r)} = \frac{P_1 - P_2}{4L\eta} (R^2 - r^2) \underline{\Delta} K \frac{R^2 - r^2}{4L}$$

where $P_1 - P_2$ is the pressure drop along the length L and where n is the coefficient of viscosity.

19

A "birdcage" coil of length $L_2$ placed between the solenoidal coil and the fluid volume with its elements parallel to the z axis. It is connected to a source of radiofrequency energy to produce a magnetic field $H_1$ rotating at the Larmor frequency $\gamma H_o$ of a population of "spins" of population density $M_o$ distributed within the fluid. The elements of the "birdcage" coil are also connected through isolation filters to a cylindrically ordered array of periodic voltages of temporal frequency $\omega_p$, where $\omega_p$ is much less than $\gamma H_o$, so as to create a time-varying electric field in the fluid which phase modulates the spins thus creating spatially ordered phase encoding along one coordinate of an orthogonal system of curvilinear coordinates that are perpendicular to the z axis.

In the slow laminar flow application the "birdcage" coil may be placed a distance $L_1$, from the fluid entry end of the solenoid coil such that $L_{11} >> v_{(o)} T_1$, where $T_1$ is the spin-lattice relaxation time and $$v_{(o)} = \frac{P_1 - P_2}{4L\eta} R^2$$

is the velocity at the center of the fluid volume, so as to magnetize the spins almost completely before they enter the "birdcage" coil.

As each elemental volume of fluid $rdrd\theta dz$ in each cylindrical lamella of radius r passes through the "birdcage" coil it acquires transverse magnetization $M_T$ so that $$M_T = M_o e^{-t/T_2} \sin \gamma H_1 t$$

where $T_2$ is the spin-spin relaxation time at the t, since each spin precesses at an angular velocity $\gamma H_1$, about the synchronously rotating circularly polarized $TM_{OO}$ radiofrequency field $H_1$, during the time t that is lies within the radiofrequency $H_1$ field in its transit through the "birdcage" coil. Since there is cylindrical symmetry, each elemental ring acquires an elemental transverse magnetization $d^2 M_T$
$d^2 M_{T_{(r,z)}} = 2 \upsilon M_o r dr dz\, e^{-t/T_2} \sin \gamma H_1 t$ at time t, at which time each such elemental ring has traversed a distance $Z = v_{(r)} t$ along the "birdcage" coil.

Substituting and integrating $$\int_0^{L_2} d^2 M_{T_{(r,z)}} dz = 2\pi M_o r dr \int_0^{L_2} \left[ e^{-\frac{z}{v_{(r)} T_2}} \sin\left( \frac{\gamma H_1}{v_{(r)}} Z \right) \right] dZ$$

$$v_{(r)} = K \frac{R^2 - r^2}{4L} \; ; K\Delta \frac{P_1 - P_2}{\eta}$$

$$dM_{T_{(r)}} = 2\pi M_o r dr \int_0^{L_2} \left[ e^{-\frac{4L}{KT_2(R^2 - r^2)} z} \sin\left( \frac{4L\gamma H_1}{K(R^2 - r^2)} Z \right) \right] dZ$$

Let $4LZ \Delta m$;

$$4L dZ \Delta dm;\; n\Delta \frac{1}{R^2 - r^2}$$

the $$dn = \frac{2rdr}{n^2} \; ; 2rdr = n^2 dn; q\Delta \frac{1}{KT_2} \; ; b\Delta \frac{\gamma H_1}{K}$$

$$M_{T_{(r)}} = \int_0^r M_{T_{(r)}} dr =$$

20

-continued $$\pi M_o \left( \frac{1}{4L} \right) \int \frac{\frac{1}{R^2 - c^2}}{\frac{1}{R^2}} n^2 \int_0^{4LL_2} e^{-qmn} \sin bmn\, dm\, dn$$

$c = r;\; u = n;\; z = m$

>Int(Int((u^2*exp(a*u*z)*sin(b*u*z)), z=0 ... L),u+RA(-2) ... (RA2−cA2)A(−1));

$$\int \frac{\frac{1}{R^2 - c^2}}{\frac{1}{R^2}} \int_0^L U^2 e^{(auz)} \sin(buz) dz\, du$$

>int(int((u^2*exp(a*u*z)*sin(b*u*z)), z=0 ... L),u=RA(−2) ... (RA2−cA2)A(−1));

$$\frac{1}{2} (bL^2 a^4 + 2b^3 L^2 a^2 + b^5 L^2 +$$

$$4e^{\left(\frac{aL}{R^2 - c^2}\right)} b^3 \cos\left( \frac{bL}{R^2 - c^2} \right) R^2 c^2 -$$

$$2e^{\left(\frac{aL}{R^2 - c^2}\right)} b^4 \sin\left( \frac{bL}{R^2 - c^2} \right) LR^2 -$$

$$2e^{\left(\frac{aL}{R^2 - c^2}\right)} b^3 \cos\left( \frac{bL}{R^2 - c^2} \right) R^4 +$$

$$2e^{\left(\frac{aL}{R^2 - c^2}\right)} b^4 \sin\left( \frac{bL}{R^2 - c^2} \right) Lc^2 -$$

$$2e^{\left(\frac{aL}{R^2 - c^2}\right)} b^3 \cos\left( \frac{bL}{R^2 - c^2} \right) c^4 +$$

$$2e^{\left(\frac{aL}{R^2 - c^2}\right)} a^4 \sin\left( \frac{bL}{R^2 - c^2} \right) LR^2 +$$

$$6e^{\left(\frac{aL}{R^2 - c^2}\right)} b \cos\left( \frac{bL}{R^2 - c^2} \right) a^2 c^4 -$$

$$2e^{\left(\frac{aL}{R^2 - c^2}\right)} a^4 \sin\left( \frac{bL}{R^2 - c^2} \right) Lc^2 +$$

$$6e^{\left(\frac{aL}{R^2 - c^2}\right)} b^2 \sin\left( \frac{bL}{R^2 - c^2} \right) aR^4 +$$

$$4e^{\left(\frac{aL}{R^2 - c^2}\right)} a^3 \sin\left( \frac{bL}{R^2 - c^2} \right) R^2 c^2 -$$

$$12e^{\left(\frac{aL}{R^2 - c^2}\right)} b^2 \sin\left( \frac{bL}{R^2 - c^2} \right) aR^2 c^2 -$$

$$12e^{\left(\frac{aL}{R^2 - c^2}\right)} b \cos\left( \frac{bL}{R^2 - c^2} \right) a^2 R^2 c^2 +$$

$$6e^{\left(\frac{aL}{R^2 - c^2}\right)} b^2 \sin\left( \frac{bL}{R^2 - c^2} \right) ac^4 +$$

$$6e^{\left(\frac{aL}{R^2 - c^2}\right)} b \cos\left( \frac{bL}{R^2 - c^2} \right) a^2 R^4 -$$

$$2e^{\left(\frac{aL}{R^2 - c^2}\right)} a^3 \sin\left( \frac{bL}{R^2 - c^2} \right) R^4 -$$

$$4e^{\left(\frac{aL}{R^2 - c^2}\right)} b \cos\left( \frac{bL}{R^2 - c^2} \right) a^3 LR^2 -$$

-continued $$2e^{(-\frac{aL}{R^2-c^2})}a^3\sin\left(\frac{bL}{R^2-c^2}\right)c^4 +$$

$$4e^{(-\frac{aL}{R^2-c^2})}b\cos\left(\frac{bL}{R^2-c^2}\right)a^3Lc^2 -$$

$$4e^{(-\frac{aL}{R^2-c^2})}b^3\cos\left(\frac{bL}{R^2-c^2}\right)aLR^2 +$$

$$4e^{(-\frac{aL}{R^2-c^2})}b^3\cos\left(\frac{bL}{R^2-c^2}\right)aLc^2)/(L^2(a^2=b^2)^3$$

$$(R^2-c^2)^2 - \frac{1}{2}(bL^2a^4=2b^3L^2a^2=b^5L^2 -$$

$$4e^{(\frac{aL}{R^2})}b^3R^2\cos\left(\frac{bL}{R^2}\right)aL - 2e^{(\frac{aL}{R^2})}b^3R^4\cos\left(\frac{bL}{R^2}\right) -$$

$$4e^{(\frac{aL}{R^2})}b^3R^2\cos\left(\frac{bL}{R^2}\right)a^3L -$$

$$2e^{(\frac{aL}{R^2})}b^4R^2\sin\left(\frac{bL}{R^2}\right)L + 6e^{(\frac{aL}{R^2})}bR^4\cos\left(\frac{bL}{R^2}\right)a^2 -$$

$$2e^{(\frac{aL}{R^2})}a^4R^2\sin\left(\frac{bL}{R^2}\right)L - 2e^{(\frac{aL}{R^2})}a^3R^4\sin\left(\frac{bL}{R^2}\right) +$$

$$6e^{(\frac{aL}{R^2})}b^{42}R^4\sin\left(\frac{bL}{R^2}\right)a)/(L^2(a^2+b^2)^3R^4)$$

$M_{T_{(r)}}$ is a real single-valued cylindrically symmetrical periodically undulating function of the radius $0 < r < R$. It depends on the fixed design selected device parameters, $R_1$, $L_1$, $L_2$; the variable design selected parameter $H_1$; the fixed sample constants $\gamma$ and $T_2$; and the measurable sample parameter K where $$K = \frac{P_1 - P_2}{\eta}$$

Thus, for a particular device design and operating mode, a radial map of $M_{T_{(r)}}$ is a unique function of K.

Further, calibrating the device so that the "rings" of higher and lower signal intensity create a unique pattern determining K yields a large variety of continuously measurable parameters.

1. Flow Rate, liquids (incompressible)

$$\frac{dV}{dt} = \int_O^R 2\pi r v_{(r)} dr = \frac{\pi(P_1-P_2)R^4}{8L\eta} = K\frac{\pi R^4}{8L}$$

2. Viscosity, liquids (incompressible)

Using conventional devices to measure P and $P_2$ yields:

$$\eta = \frac{P_1 - P_2}{K}$$

3. Flow Rate, gases (compressible)

Using conventional devices to measure $P_1$ and $P_2$ yields:

$$\frac{dV_o}{dt} = \frac{\pi(P_1-P_2)R^4}{8L\eta} \circ \frac{P_1+P_2}{2P_o}$$

where $$\frac{dV_o}{dt}$$

is the time rate of flow of gas at volume $V_o$ and pressure $P_o$ $$\frac{dV_o}{dt},$$

$P_1$, $P_2$, and $P_o$ can be measured by conventional devices.

This permits the continuous measurement of gas viscosity $\eta$ which, in turn, permits computation of the mean free path, thermal conductivity, specific heat, diffusion, and absolute temperature from the kinetic theory of gas viscosity.

The embodiments were chosen and described in order to best explain the principles of the invention and their practical application to thereby enable others skilled in the art to best utilize the invention and various embodiments and with various modifications as are suited to the particular use contemplated. It is intended that the scope of the invention only be limited by the claims appended hereto.

I claim:

1. An apparatus for detecting fluid flow, comprising:
   means for generating a homogeneous magnetic field along a longitudinal axis of a pipe for containing said fluid flow;
   a plurality of conductive wires arranged in parallel to each other and to said pipe and formed in a shape of a cylinder;
   a first ring conductor for joining said conductive wires at one end of said conductive wires;
   a second ring conductor for joining said conductive wires at an end opposite said one end of said conductive wires;
   means for generating a time varying voltage and for applying said time varying voltage to at least one pair of said plurality of conductive wires;
   said time varying voltage producing a time varying electric field in said pipe and a linear magnetic field gradient in said pipe: and
   means for detecting output signals generated by fluid within said pipe and for determining a characteristic of said fluid flow based on said output signals.

2. An apparatus as set forth in claim 1, wherein said conductive wires are arranged in a bird cage configuration that is tuned to a Larmor frequency of said fluid.

3. An apparatus as set forth in claim 1, further comprising:
   means for generating RF fields having a frequency centered near a Larmor frequency of said fluid; and
   means for applying said RF fields to said conductive wires;
   wherein said RF fields become circularly polarized and rotate about said conductive wires.

4. An apparatus as set forth in claim 1, further comprising:
   a first set of filters connected on said first ring conductor between said conductive wires for tuning said conductive wires near a Larmor frequency of said fluid; and
   a second set of filters connected between said applying means and said first ring conductor for passing through said first frequency and for filtering out said Larmor frequency.

23

5. An apparatus as set forth in claim 1, wherein said conductive wires comprise said detecting means and said apparatus further comprises means for processing the output signals in order to produce an image of said fluid flow.

6. An MRI apparatus for producing an image of an object, comprising:
- means for generating oscillating gradients to modulate an angular momentum of spins of nuclei within said object and for producing output signals which are detected in a receiver coil;
- means for synchronously demodulating said output signals to yield a periodic envelope signal containing integral harmonics of an oscillating gradient frequency;
- means for synchronously detecting said periodic envelope signal to yield individual harmonic components of the envelope signal; and means for reconstructing the image of the object by approximation using a matrix solution using the detected periodic envelope signal.

7. A method for detecting fluid flow through a pipe, comprising the steps of:
- producing a homogeneous magnetic field throughout of a certain length of said pipe and along a first axis concentric with a longitudinal axis of the pipe;
- generating a radiofreguency signal;
- receiving at a receiving means said radiofrequency signal and generating radiofrequency fields across said pipe within said certain length in order to excite spins of nuclei within said fluid;
- detecting signals emitted by said nuclei within said fluid after the step of generating said radiofrequency fields; and
- processing the detected signals and mapping said fluid flow;
- wherein said radiofrequency fields produce linear magnetic field gradients in said fluid.

8. A method for generating images as set forth in claim 7, further comprising the steps of:
- arranging a plurality of conductive wires in parallel to each other in a shape of a cylinder around the pipe;
- joining said plurality of conductive wires with a first ring conductor at one end of said conductive wires;
- joining said plurality of conductive wires with a second ring conductor at an end opposite said one end of said conductive wires;
- wherein said first electric field rotates about said conductive wires at said Larmor frequency of said fluid.

9. A method for generating images as set forth in claim 33, wherein said step of generating said radiofrequency fields is performed by an antenna structure that also performs said step of detecting said signals.

24

10. A method for generating images as set forth in claim 7, wherein said step of processing uses a projection reconstruction technique to produce an image of flow of said fluid.

11. A method for generating images as set forth in claim 7, wherein said step of processing employs at least one look up table containing Bessel functions when processing said detected signals to produce an image of flow of said fluid.

12. A method for generating images as set forth in claim 7, wherein said step of processing employs at least one look up table containing solutions to Sommerfeld's integral when processing an detected signals to produce said image of flow of said fluid.

13. The MRI apparatus as set forth in claim 6, wherein said demodulating means comprises a synchronous double balanced demodulator.

14. (Newly Added) The MRI apparatus as set forth in claim 6, wherein said detecting means comprises an integrator for determining amplitudes of said individual harmonic components of the envelope signal.

15. The MRI apparatus as set forth in claim 6, wherein said detecting means comprises:
- an isolation amplifier for receiving said periodic envelope signal;
- a double balanced demodulator for receiving an output of said isolation amplifier; and
- an integrator for integrating an output of said double balanced demodulator and for generating said individual harmonic components of the envelope signal.

16. The apparatus as set forth in claim 1, wherein said generating means comprises a solenoid coil.

17. The apparatus as set forth in claim 1, wherein said pipe is non-conductive and nonferromagnetic and said plurality of conductive wires are positioned outside said pipe.

18. The apparatus as set forth in claim 1, wherein said generating means produces a pulse for flipping spins of nuclei within said fluid flow.

19. The apparatus as set forth in claim 1, wherein said generating means continuously generates a radiofrequency field to produce a spatially phase encoded transverse magnetization in nuclei within said fluid flow.

20. The apparatus as set forth in claim 1, wherein said detecting means maps the characteristic of flow velocity for said fluid flow.

21. The method as set forth in claim 7, wherein said step of generating said radiofrequency fields comprises the step of pulsing radiofrequency fields so as to repetitively flip spins of said nuclei within said fluid.

22. The method as set forth in claim 7, wherein said step of generating said radiofrequency fields comprises the step of continuously producing said radiofrequency fields.

* * * * *